US012721079B2

(12) United States Patent
Tachibana

(10) Patent No.: US 12,721,079 B2
(45) Date of Patent: Aug. 25, 2026

(54) SUBSTRATE PROCESSING METHOD AND SUBSTRATE PROCESSING APPARATUS

(71) Applicant: Tokyo Electron Limited, Tokyo (JP)

(72) Inventor: Kouzou Tachibana, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 123 days.

(21) Appl. No.: 18/728,564

(22) PCT Filed: Jan. 5, 2023

(86) PCT No.: PCT/JP2023/000099
§ 371 (c)(1),
(2) Date: Jul. 12, 2024

(87) PCT Pub. No.: WO2023/136200
PCT Pub. Date: Jul. 20, 2023

(65) Prior Publication Data

US 2025/0087476 A1 Mar. 13, 2025

(30) Foreign Application Priority Data

Jan. 13, 2022 (JP) ................................ 2022-003849

(51) Int. Cl.

| | |
|---|---|
| ***H01L 21/02*** | (2006.01) |
| ***H10P 14/69*** | (2026.01) |
| ***H10P 70/00*** | (2026.01) |
| ***H10P 72/00*** | (2026.01) |
| ***H10P 72/76*** | (2026.01) |

(52) U.S. Cl.
CPC .......... *H10P 70/15* (2026.01); *H10P 14/6903* (2026.01); *H10P 72/0414* (2026.01); *H10P 72/7618* (2026.01)

(58) Field of Classification Search
None
See application file for complete search history.

(56) References Cited

U.S. PATENT DOCUMENTS

2007/0295365 A1* 12/2007 Miya ...................... H10P 70/20 134/33

FOREIGN PATENT DOCUMENTS

| | | |
|---|---|---|
| JP | H09-038595 A | 2/1997 |
| JP | H11-265867 A | 9/1999 |
| JP | 2003-124175 A | 4/2003 |
| JP | 2008-016548 A | 1/2008 |

(Continued)

OTHER PUBLICATIONS

International Search Report for PCT/JP2023/000099 dated Feb. 28, 2023, 4 pages.

*Primary Examiner* — Eric W Golightly
(74) *Attorney, Agent, or Firm* — Chrisman Gallo Tochtrop LLC

(57) ABSTRACT

A substrate processing method of cleaning a substrate having a patterned Si film while removing an oxide on the Si film includes removing the oxide by supplying a cleaning liquid containing hydrofluoric acid and water to the substrate while rotating the substrate; and mixing an organic solvent, which has miscibility with the water and has a lower surface tension than the water, into the cleaning liquid. The mixing of the organic solvent is performed during the removing of the oxide and after a predetermined time has elapsed from a start of the removing of the oxide.

12 Claims, 9 Drawing Sheets

(56) References Cited

FOREIGN PATENT DOCUMENTS

| | | | |
|---|---|---|---|
| JP | 2018/046063 | A | 3/2018 |
| WO | 2019/151090 | A1 | 8/2019 |

* cited by examiner 70
16
20
Ai
40
Ai
Ni
Ni
W
31b
31a
Nb
50
51
52
30
31
32
32b
32a
Z
X 46A
46B
46C
40
41(42,43)
P
P
P
44
411(421,431)
P
F
T
CO2
45A
45B
45C
45D A1
N1
DHF
W
DHF
Nb A1
N1
DHF+IPA
W
DHF
Nb A1
N1
DIW+IPA
W
DIW
Nb A2
N2
DIW
A1
N1
DIW
W
DIW
Nb A2
N2
DIW
W
DIW
Nb A1
A2
N2
DIW
N3
IPA
W
Nb A1
N3
IPA
W
Nb A1
N1
DHF
W
DHF
Nb A1
N1
DHF+IPA
W
DHF
Nb A1
N1
DIW+IPA
W
DIW
Nb A2
N2
DIW+IPA
A1
N1
DIW+IPA
W
DIW
Nb A2
N2
DIW+IPA
W
DIW
Nb A1
A2
N2
DIW+IPA
N3
IPA
W
Nb A1
N3
IPA
W
Nb A1
N1
DHF
W
DHF
Nb A1
N1
DHF+IPA
W
DHF
Nb A1
N1
DIW+IPA
W
DIW
Nb A1
N3
N1
IPA
DIW+IPA
W
DIW
Nb A1
N3
IPA
W
Nb

SUBSTRATE PROCESSING METHOD AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2023/000099 filed on Jan. 5, 2023, which claims the benefit of Japanese Patent Application No. 2022-003849 filed on Jan. 13, 2022, the entire disclosures of which are incorporated herein by reference.

TECHNICAL FIELD

The various aspects and embodiments described herein pertain generally to a substrate processing method and a substrate processing apparatus.

BACKGROUND

In a semiconductor device manufacturing process, there is performed a cleaning processing of removing an oxide from a surface of a Si film having a pattern. This cleaning processing includes a cleaning process of removing the oxide by using, for example, DHF, a rinsing process of removing the DHF used in the cleaning process and a reaction product by using a rinse liquid, a solvent replacing process of replacing the rinse liquid with a low surface tension solvent such as IPA, and a drying process of removing the solvent from the substrate to dry the substrate (see, for example, Patent Document 1).

Patent Document 1: Japanese Patent Laid-open Publication No. H9-38595

SUMMARY

In an exemplary embodiment, a substrate processing method of cleaning a substrate having a patterned Si film while removing an oxide on the Si film includes removing the oxide by supplying a cleaning liquid containing hydrofluoric acid and water to the substrate while rotating the substrate; and mixing an organic solvent, which has miscibility with the water and has a lower surface tension than the water, into the cleaning liquid. The mixing of the organic solvent is performed during the removing of the oxide and after a predetermined time has elapsed from a start of the removing of the oxide.

DETAILED DESCRIPTION

An exemplary embodiment of a substrate processing apparatus will be described with reference to the accompanying drawings.

Figure 1:
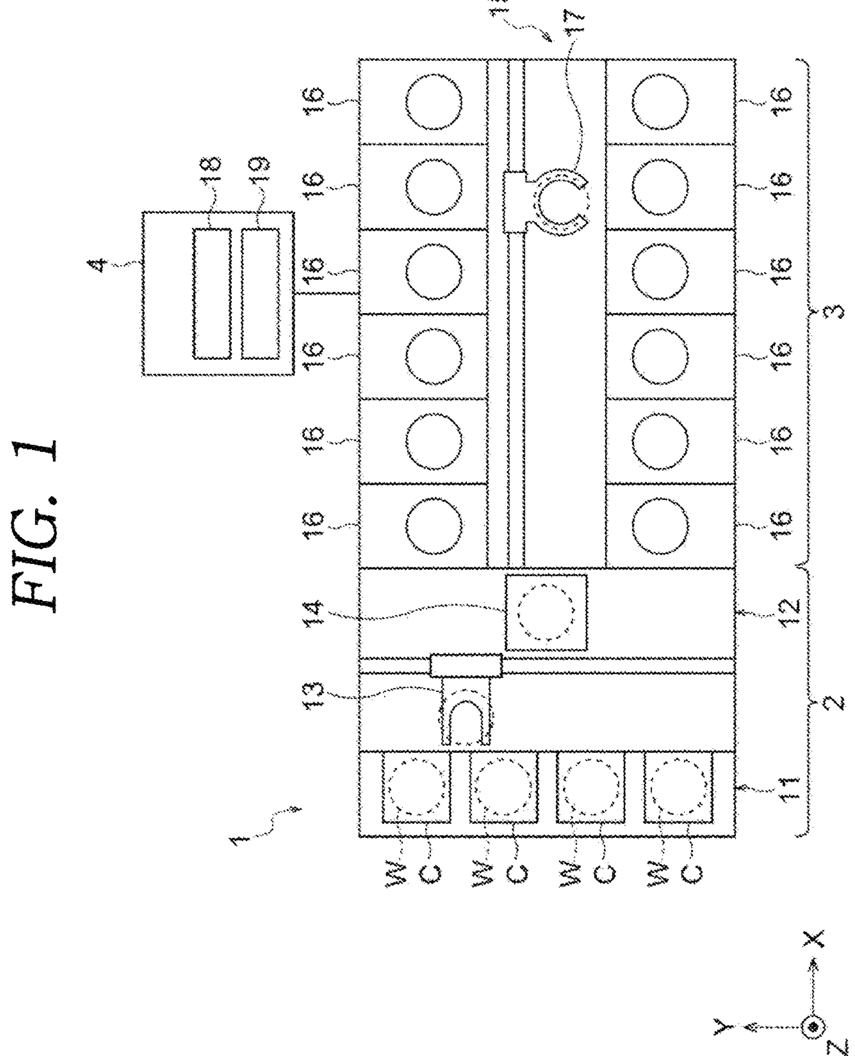
FIG. 1 is a schematic transversal cross sectional view of a substrate processing system according to an exemplary embodiment of a substrate processing apparatus.

FIG. 1 is a diagram illustrating a schematic configuration of a substrate processing system according to the exemplary embodiment. In the following, in order to clarify positional relationships, the X-axis, the Y-axis and the Z-axis which are orthogonal to each other will be defined, and the positive Z-axis direction will be regarded as a vertically upward direction.

As shown in FIG. 1, a substrate processing system 1 includes a carry-in/out station 2 and a processing station 3. The carry-in/out station 2 and the processing station 3 are provided adjacent to each other.

The carry-in/out station 2 is equipped with a carrier placing section 11 and a transfer section 12. In the carrier placing section 11, a plurality of carriers C is placed to horizontally accommodate therein a plurality of substrates W such as semiconductor wafers in the present exemplary embodiment.

The transfer section 12 is provided adjacent to the carrier placing section 11 and equipped with a substrate transfer device 13 and a delivery section 14. The substrate transfer device 13 is equipped with a substrate holding mechanism configured to hold the substrate W. Further, the substrate transfer device 13 is configured to be movable in a horizontal direction and a vertical direction and pivotable around a vertical axis, and serves to transfer the substrates W between the carriers C and the delivery section 14 by using the substrate holding mechanism.

The processing station 3 is provided adjacent to the transfer section 12. The processing station 3 is equipped with a transfer section 15 and a plurality of processing modules 16. The plurality of processing modules 16 are arranged at both sides of the transfer section 15.

The transfer section 15 is provided with a substrate transfer device 17 therein. The substrate transfer device 17 is equipped with a substrate holding mechanism configured to hold the substrate W. Further, the substrate transfer device 17 is configured to be movable in a horizontal direction and a vertical direction and pivotable around a vertical axis, and serves to transfer the substrates W between the delivery section 14 and the processing modules 16 by using the substrate holding mechanism.

Each of the processing modules 16 is configured to perform a preset substrate processing on the substrate W transferred by the substrate transfer device 17.

Further, the substrate processing system 1 is equipped with a control device 4. The control device 4 is, for example, a computer, and includes a controller 18 and a storage 19. The storage 19 stores therein a program that controls various processings performed in the substrate processing system 1. The controller 18 controls an operation of the substrate processing system 1 by reading and executing the program stored in the storage 19.

Further, the program may have been recorded in a computer-readable recording medium and may be installed from the recording medium to the storage 19 of the control device 4. The computer-readable recording medium may be, by way of non-limiting example, a hard disk (HD), a flexible disk (FD), a compact disk (CD), a magneto optical disc (MO), a memory card, or the like.

In the substrate processing system 1 configured as described above, the substrate transfer device 13 of the carry-in/out station 2 first takes out the substrate W from the carrier C placed in the carrier placing section 11 and then places the taken substrate W in the delivery section 14. The substrate W placed in the delivery section 14 is taken out from the delivery section 14 by the substrate transfer device 17 of the processing station 3 and carried into the processing module 16.

The substrate W carried into the processing module 16 is processed by the processing module 16, and is then carried out from the processing module 16 and placed in the delivery section 14 by the substrate transfer device 17. The completely processed substrate W placed in the delivery section 14 is returned back into the carrier C of the carrier placing section 11 by the substrate transfer device 13.

Now, a configuration of the processing module 16 will be described with reference to FIG. 2.

The processing module 16 has a chamber 20 that defines a processing space. A fan filter unit (FFU) 70 is provided at a ceiling portion of the chamber 20. The FFU 70 is configured to discharge a clean gas (for example, clean air) downwards into the chamber 20.

The processing module 16 is provided with a spin chuck (substrate holding/rotating mechanism) 30. The spin chuck 30 has a substrate holder (chuck) 31 configured to hold the substrate W horizontally, and a rotation driver 32 configured to rotate the substrate holder 31 and the substrate W held thereon around a vertical axis. In the shown example, the rotation driver 32 has an electric motor 32*a*, and a rotation shaft 32*b* that connects the electric motor 32*a* and the substrate holder 31.

The substrate holder 31 may be of a so-called mechanical chuck type configured to mechanically hold a periphery of the substrate W with a holding member such as a grip claw or the like, or may be of a so-called vacuum chuck type configured to vacuum-attract a central portion of a rear surface of the substrate W.

In the present exemplary embodiment, since a processing liquid is supplied to the central portion of the rear surface of the substrate W during a liquid processing, the substrate holder 31 of a mechanical chuck type is employed. The illustrated substrate holder 31 has a circular plate-shaped base 31*a*, and a plurality of gripping claws 31*b* provided at a periphery of the base 31*a* at a regular distance therebetween along a circumferential direction. When the substrate holder 31 is holding the substrate W with the gripping claws 31*b*, a gap is formed between the base 31*a* and the substrate W.

The processing module 16 is equipped with a processing fluid supply 40 configured to supply various types of processing fluids required to process the substrate W to the substrate W.

Figures 2, 3:
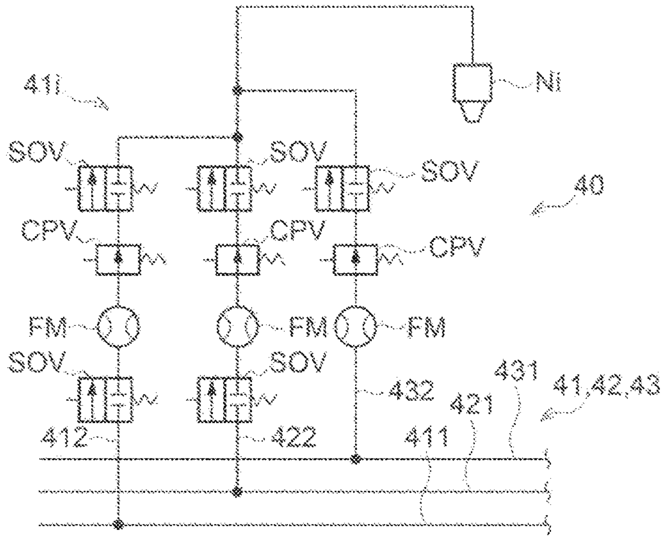
FIG. 2 is a schematic longitudinal cross sectional view illustrating a configuration example of a processing module belonging to the substrate processing system of FIG. 1.
FIG. 3 is a diagram illustrating a configuration example of a processing liquid supply mechanism that enables discharge of one type of processing liquid alone or a mixture of two or more types of processing liquids selected from multiple types of processing liquids from a single nozzle in the processing module.

The processing fluid supply 40 has a plurality of nozzles Ni (four nozzles are shown in FIG. 2) each configured to discharge a processing fluid toward a front surface of the substrate W. In order to distinguish the individual nozzles Ni from each other, the nozzles Ni will be assigned reference numerals N1, N2, N3, N4, . . . when necessary. The processing fluid supply 40 also has at least one nozzle Nb (one in the shown example) configured to discharge a processing fluid toward the central portion of the rear surface of the substrate W. The processing fluid supply 40 may also have another nozzle (not shown and having the same configuration as the nozzle Nb) configured to supply an inert gas (for example, a nitrogen gas) to the central portion of the rear surface of the substrate W.

The plurality of nozzles Ni are supported on leading ends of one or more nozzle arms Ai (two nozzle arms are shown in FIG. 2). The nozzle arm Ai is configured to be able to locate the nozzle Ni supported thereon at least at any position (radial position) between a position above the center of the substrate W held by the substrate holder 31 and a position above the periphery of the substrate W. The nozzle arm may be of a type that is pivotable around a vertical axis, or may be of a type that can be translated along a guide rail. In order to distinguish the individual nozzle arms Ai from each other, a natural number will be assigned to 'i', and the nozzle arms Ai will be assigned reference numerals A1, A2, A3, A4, . . . when necessary.

A processing liquid is supplied to each nozzle Ni from a corresponding processing liquid supply mechanism 40*i* (which forms a part of the processing fluid supply 40). In the present exemplary embodiment, DHF (dilute hydrofluoric acid (hydrofluoric acid diluted with water)), IPA (isopropyl alcohol), DIW, or DIW in which $CO_2$ (carbon dioxide) gas is dissolved are used as the processing liquid.

For example, one of DHF, a mixed solution of DHF and IPA, DIW, and a mixed solution of DIW and IPA is discharged as a processing liquid from the nozzle Ai. A configuration example of the processing liquid supply mechanism 40*i* that supplies the processing liquid to the nozzle Ai is illustrated in FIG. 3. The processing liquid supply mechanism 40*i* forms a part of a processing fluid supply.

The processing liquid supply mechanism 40*i* includes a first liquid circulation line 411 forming a part of a source 41 (processing liquid source) of a first liquid (here, DHF), and a second liquid circulation line 421 forming a part of a source 42 (processing liquid source) of a second liquid (here, DIW), and a third liquid circulation line 431 forming a part of a source (processing liquid source) 43 of a third liquid (here, IPA). Each of the sources 41, 42, and 43 also forms a part of the processing fluid supply 40. A first liquid branch line 412, a second liquid branch line 422, and a third liquid branch line 432 are branched off from the first liquid circulation line 411, the second liquid circulation line 421, and the third liquid circulation line 431, respectively.

In FIG. 3, a member given a reference sign SOV is an opening/closing valve, a member given a reference sign CPV is a constant pressure valve, and a member given a reference sign FM is a flow meter. In one example, in each of the branch lines 412, 422, and 432, a non-illustrated electropneumatic regulator controls the pilot pressure of the constant pressure valve CPV based on a deviation between a detection value of the flow meter FM and a target flow rate value, so that the flow rate of a liquid flowing through the corresponding branch line is controlled to a required value. By controlling the constant pressure valve CPV and opening and closing of the opening/closing valve SOV of each branch line, one of DHF, DIW, and IPA alone or a mixture of at least two of them in a certain mixing ratio may be discharged from the nozzle Ni as the processing liquid.

For example, for the nozzle Ni configured to discharge either DIW or a mixture of DIW and IPA as the processing liquid, a processing liquid supply mechanism excluding the configuration related to DHF from the configuration in FIG. 3 may be used. Also, for the nozzle Ni configured to discharge only IPA as the processing liquid, a processing liquid supply mechanism excluding the configuration related to DHF and DIW may be employed. Illustration of these processing liquid supply mechanisms is omitted.

A configuration example of the processing liquid source will be described with reference to FIG. 4. The processing liquid source has a tank 44, and the above-described circulation line 411 (or 421, or 431) connected to the tank 44. Source liquid(s) for the processing liquid to be combined may be supplied into the tank 44 from sources 46A, 46B, and 46C (which are usually provided as a factory supply in a semiconductor manufacturing plant) of the source liquid(s) (for example, at least one (e.g., three) of HF, DIW and IPA). The circulation line 411 (or 421, or 431) includes a pump 45A configured to form a circulating flow, a filter 45B configured to remove a particle contained in the processing liquid, a temperature controller 45C configured to control the temperature of the processing liquid, and so forth. When the processing liquid supplied from the processing liquid source is CO2 water (prepared by dissolving carbon dioxide in DIW), a carbon dioxide gas dissolution module 45D may be provided in the circulation line to dissolve a carbon dioxide gas in the DIW flowing through the circulation line. Further, in FIG. 4, each of the plurality of branch lines 412 to 432 may be branched at a position indicated by a reference sign P. Each branch line supplies the processing liquid to each processing module 16 included in the substrate processing system.

Figures 4, 5A, 5B:
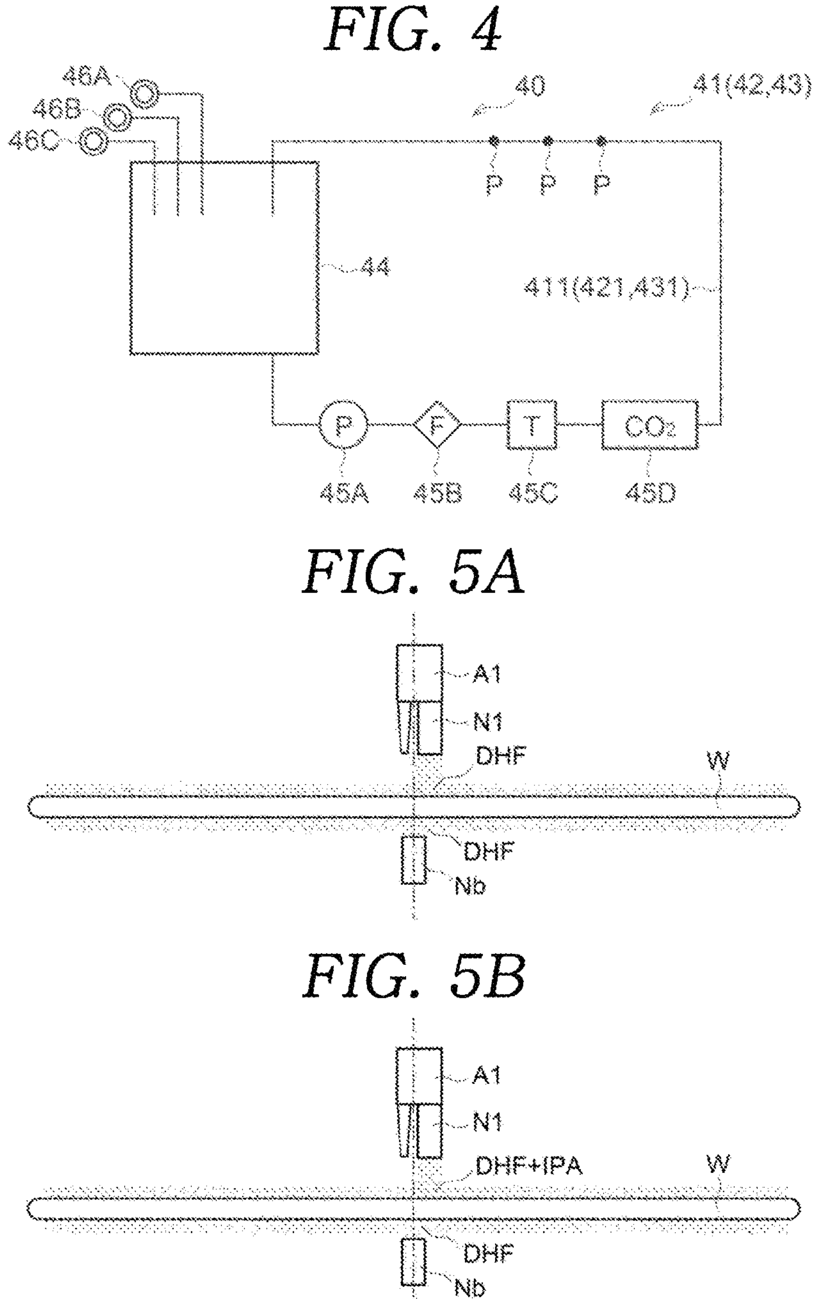
FIG. 4 is a diagram illustrating a configuration example of a processing liquid source that supplies a processing liquid to the processing liquid supply mechanism.
FIG. 5A is a diagram for describing a first exemplary embodiment of a substrate processing method.
FIG. 5B is a diagram for describing the first exemplary embodiment of the substrate processing method.

For example, when discharging a mixed solution of DHF and IPA from the nozzle, HF, DIW, and IPA may be mixed in a predetermined ratio in the tank shown in FIG. 4. Instead of this, in the processing liquid supply mechanism shown in FIG. 3, multiple types of liquids (for example, DHF and IPA) may be mixed immediately before the processing liquid is discharged from the nozzle.

A liquid receiving cup 50 is provided around the substrate holder to collect the processing liquid scattered from the substrate W being rotated. The processing liquid collected by the liquid receiving cup 50 is drained to the outside of the processing module 16 from a liquid drain port 51 provided at a bottom of the liquid receiving cup 50. An exhaust port 52 is also provided at the bottom of the liquid receiving cup 50, and the inside of the liquid receiving cup 50 is suctioned through the exhaust port 52. Due to this suctioning, a gas above the substrate W is drawn into the liquid receiving cup 50 from between the periphery of the substrate W and a periphery of a top opening of the liquid receiving cup 50, and is then exhausted from the liquid receiving cup 50 through the exhaust port 52 after flowing around the periphery of the substrate W.

Now, exemplary embodiments of a substrate processing method will be described.

Figure 9:
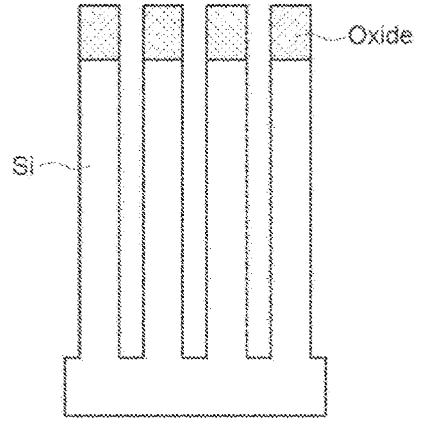
FIG. 9 is a schematic cross sectional view illustrating a structure of a substrate processed by the substrate processing method.

A substrate to be processed is a silicon substrate, and a large number of recesses (for example, trenches) having a high aspect ratio are formed in a front surface thereof, and an oxide film (SiOx) is formed on the outermost portion thereof (see FIG. 9). The substrate processing method described below pertains to removing the oxide film while suppressing particles from remaining at bottoms of the recesses.

Further, in the following description, functional water or a mixed solution of functional water and IPA may be used instead of DIW or a mixed solution of DIW and IPA as a processing liquid for rinsing. Here, ‘functional water’ is water that has been given properties that DIW does not have, such as conductivity, by dissolving a carbon dioxide gas or a minute amount of ammonia in DIW. This functional water is often used for the purpose of suppressing electrostatic destruction of a device formed on the substrate W, or for the purpose of suppressing adhesion of particles by controlling the potentials (zeta potentials) of the substrate surface and the particles. The functional water can be supplied to both the front surface and the rear surface of the substrate. Furthermore, in the exemplary embodiments to be described below, in case of using the functional wafer, DIW in which a carbon dioxide gas is dissolved (also referred to as $CO_2$ water) can be used.

First Exemplary Embodiment

Below, a first exemplary embodiment of the substrate processing method will be described with reference to FIG. 5A to FIG. 5G. In the following description, different processing liquids are discharged from the same nozzle N1, which is possible as is clear from the description previously given with reference to FIG. 3. Alternatively, a nozzle for discharging DHF and a mixed solution of DHF and IPA and a nozzle for discharging DIW and a mixed solution of DIW and IPA may be configured as separate nozzles.

<Process 1> DHF Cleaning

While rotating the substrate W at a rotation speed of 1500 rpm, DHF is discharged at a discharge flow rate of, e.g., 1.5 L/min or more (for example, 2 L/min) from the nozzle N1 of the arm A1 toward the front surface of the substrate (see FIG. 5A). A landing point of the DHF on the substrate surface is, for example, a position 15 mm away from a rotation center of the substrate W. The DHF flows while diffusing toward the periphery of the substrate W due to a centrifugal force, and, as a result, the front surface of the substrate is covered with a liquid film of the DHF. Also, DHF is discharged from the nozzle Nb toward the central portion of the rear surface of the substrate W at a discharge flow rate of, e.g., 1 L/min. Due to this DHF, the rear surface of the substrate is also covered with the liquid film of the DHF. The oxide film formed on the outermost portion of the substrate is removed (etched) by the DHF.

Here, even if the landing point of the processing liquid discharged from the nozzle N1 on the front surface of the substrate W is somewhat far from the rotation center of the substrate, there occurs no problem of runout of the liquid at the rotation center of the substrate (that is, the liquid dries up so the substrate surface is exposed to the atmosphere) as long as the rotation center of the substrate W is covered with the processing liquid that is diffused due to the impact of the landing. If the processing liquid is discharged from the nozzle at a sufficiently high discharge flow rate, it is ensured that the rotation center of the substrate W is reliably covered by the processing liquid that is diffused due to the momentum of the landing. This also applies to the subsequent processes.

<Process 2> DHF+IPA Cleaning

When the oxide film is almost completely removed in the process 1, the processing proceeds to a process 2. The timing at which the oxide film is almost completely removed can be determined through an experiment, for example.

In the process 2, instead of the DHF, a mixed solution of DHF and IPA is supplied from the nozzle N1 to the front and rear surfaces of the substrate W, and the DHF is continuously supplied from the nozzle Nb (see FIG. 5B). That is, at this time, a mixing process of mixing the DHF and the IPA is performed within the processing liquid supply mechanism 40*i* for the nozzle N1. The rotational speed of the substrate W and the position of the nozzle N1 may be the same as those in the process 1. The discharge flow rate of the mixed solution from the nozzle N1 may be set to, e.g., 1 L/min. An IPA content in the mixed solution is desirably set to be 5 vol % or more. Here, it is set to, e.g., 10 vol %. By setting the IPA content to this level, the mixed solution may certainly reach a bottom of a recess of a pattern.

When the mixed solution of the DHF and the IPA is used as the processing liquid, an etch rate of the oxide film is lowered as compared to a case when only the DHF is used as the processing liquid. That is, if the mixed solution of the DHF and the IPA is used from the beginning, the time required to remove the oxide film becomes longer, resulting in reduction of a throughput of the apparatus. For this reason, at the very beginning of the liquid processing, only the DHF is used as the processing liquid. Since the oxide film to be removed is formed only on the outermost portion of the substrate W, there will be no particular problem even if the processing liquid does not reliably reach the bottom of the recess in the process 1.

<Process 3> DIW+IPA Rinsing

After performing the process 2 for a predetermined period of time, a mixed solution of DIW (or $CO_2$ water) and IPA as a rinse liquid is discharged from the nozzle N1 onto the front surface of the substrate at a discharge flow rate of, e.g., 1.5 L/min or more. Also, DIW (or $CO_2$ water) as a rinse liquid is discharged from the nozzle Nb onto the rear surface of the substrate at a discharge flow rate of, for example, 1.5 L/min or more (see FIG. 5C). The rotation speed of the substrate W may be set to be 1500 rpm, the same as in the process 1. The nozzle N1 is placed directly above the rotation center of the substrate W so that the landing point of the mixed solution on the front surface of the substrate W coincides with the rotation center of the substrate W. An IPA content in the mixed solution is desirably set to be 5 vol % or more. Here, it is set to, e.g., 10 vol %. By setting the IPA content to this level, the mixed solution may certainly reach the bottom of the recess of the pattern.

In this process 3, the processing liquid used in the processes 1 and 2 and reaction by-products are washed away from the substrate by the rinse liquid. Since the mixed solution of the DIW (or $CO_2$ water) and the IPA is supplied onto the front surface of the substrate W as the rinse liquid, it is ensured that the mixed solution reach the bottom of the recess of the pattern. Therefore, rinsing can be performed securely up to the bottom of the recess of the pattern.

<Process 4> 2-Nozzle DIW Rinsing

After performing the process 3 for a preset period of time, DIW (or $CO_2$ water) as a rinse liquid is discharged onto the front surface of the substrate from the nozzle N1 of the arm A1 at a discharge flow rate of, e.g., 1.5 L/min. Concurrently, the nozzle N2 of the arm A2, which has been located at a standby position, is moved to above the center of the substrate W, and DIW (or $CO_2$ water) as a rinse liquid is also discharged from the nozzle N2 onto the front surface of the substrate at a discharge flow rate of, e.g., 1.5 L/min (see FIG. 5D). Here, the standby position of the nozzle is a position outside the liquid receiving cup 50 when viewed from the top. At this time, landing points of the DIW discharged from the respective nozzles N1 and N2 on the front surface of the substrate W are set to be as close to the rotation center of the substrate W as possible within a range where the arms A1 and A2 do not collide. As an example, a landing point P1 of the DIW from the nozzle N1 is located 20 mm away from the rotation center of the substrate W, and the landing point P2 of the DIW from the nozzle N2 is located 25 mm away from the rotation center of the substrate W. Here, however, the landing points P1 and P2 are on opposite sides with respect to the rotation center of the substrate W therebetween. The rotation speed of the substrate W may be set to be 1500 rpm, the same as in the process 1.

<Process 5> Transition from 2-Nozzle DIW Rinsing to 1-Nozzle DIW Rinsing

Next, the nozzle N1 of the arm Ai is moved to the periphery of the substrate W while maintaining the state in which it is discharging the DIW (or $CO_2$ water). Then, the discharge of the DIW from the nozzle N1 is stopped, and the nozzle N1 is moved to the standby position (scan-out of the nozzle N1). When the nozzle N1 starts to be moved toward the periphery of the substrate W, the nozzle N2 of the arm A2 is moved such that the landing point of the DIW (or $CO_2$ water) from the nozzle N2 on the front surface of the substrate W becomes the rotation center of the substrate W, and the discharge flow rate of the DIW from the nozzle N2 is increased up to 2.0 L/min. Accordingly, the processing proceeds from the rinsing by the DIW discharged from the two nozzles to the rinsing by the DIW discharged from the single nozzle (see FIG. 5E).

In addition, in the process 5, DIW is also discharged from the nozzle Nb to the central portion of the rear surface of the substrate at a discharge flow rate of 1.0 L/min.

<Process 6> Transition from 1-Nozzle DIW Rinsing to IPA Replacement

After performing the 1-nozzle DIW rinsing in the process 5 for a predetermined period of time, the nozzle N3 of the arm A1, which has been located at the standby position, is moved to a position directly above the rotation center of the substrate W. Thereafter, IPA is discharged from the nozzle N3 at a discharge flow rate of, e.g., 75 mL/min. Then, the rotation speed of the substrate W is reduced from 1500 rpm to 1000 rpm, for example. The IPA may have a room temperature. In order to avoid collision of the arms A1 and A2, the nozzle N2 of the arm A2 starts to be moved toward the periphery of the substrate W while carrying on the discharge of the DIW immediately before the nozzle N3 reaches the position directly above the rotation center of the substrate W. Once the nozzle N2 reaches the periphery of the substrate W, the discharge of the DIW from the nozzle N2 is stopped, and the nozzle N2 is moved to the standby position (scan-out of the nozzle N2) (see FIG. 5F). Further, when the scan-out of the nozzle N2 is started, the rotation speed of the substrate W is reduced from 1000 rpm to 700 rpm, for example.

<Process 7> IPA Replacement

Figures 5C, 5D, 5E, 5F:
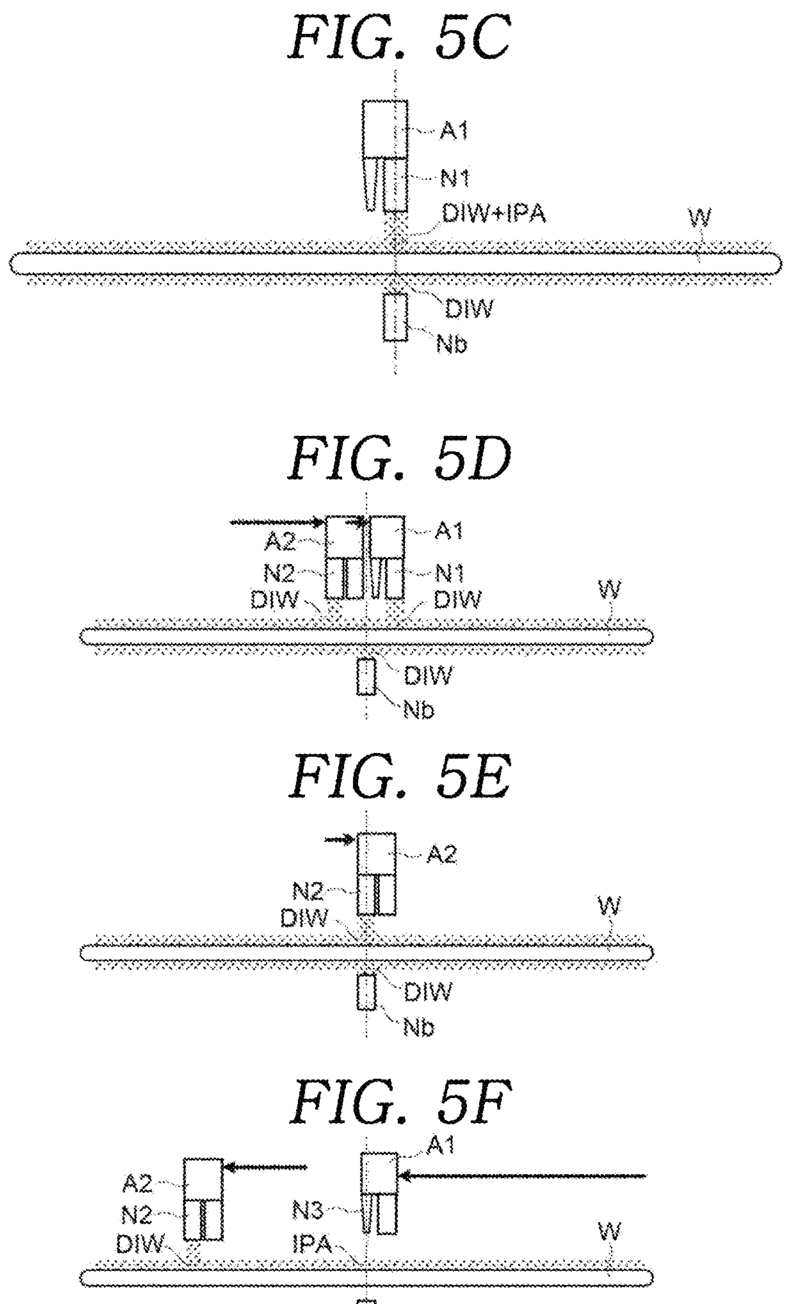
FIG. 5C is a diagram for describing the first exemplary embodiment of the substrate processing method.
FIG. 5D is a diagram for describing the first exemplary embodiment of the substrate processing method.
FIG. 5E is a diagram for describing the first exemplary embodiment of the substrate processing method.
FIG. 5F is a diagram for describing the first exemplary embodiment of the substrate processing method.
Figures 5G, 6A, 6B:
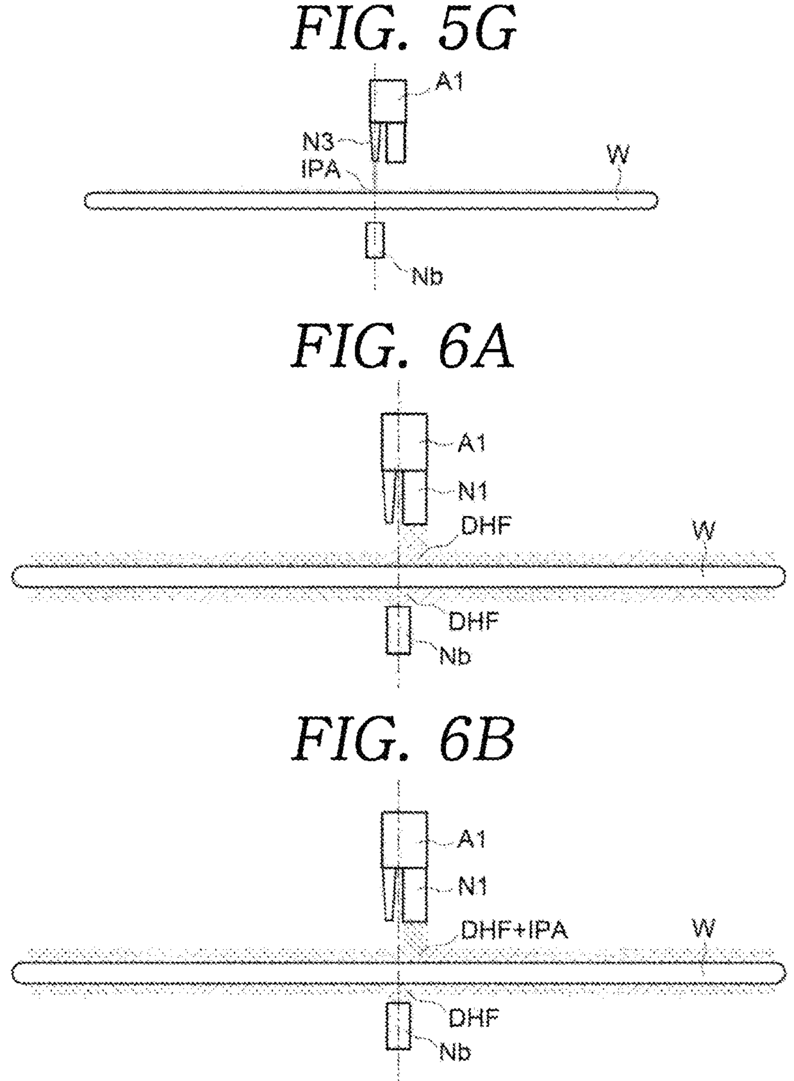
FIG. 5G is a diagram for describing the first exemplary embodiment of the substrate processing method.
FIG. 6A is a diagram for describing a second exemplary embodiment of the substrate processing method.
FIG. 6B is a diagram for describing the second exemplary embodiment of the substrate processing method.

By continuously discharging the IPA from the nozzle N3 of arm A1 for a predetermined period of time under the conditions described in the process 5, the DIW on the front surface of the substrate W (including the inside of the recess) is replaced with the IPA (see FIG. 5G).

<Process 8> Drying

Thereafter, the substrate W is dried by removing the IPA on the substrate W. As a specific example, the substrate W can be dried by commonly known drying methods as follows.

Drying Method 1

The discharge of the IPA from the nozzle N3 is stopped, and the rotation speed of the substrate W is increased to, e.g., about 1500 rpm. As a result, a dry core (a region that is not wet by the IPA) is formed at the center of the substrate W, and this dry core gradually spreads outwards in the radial direction, so that the substrate W is dried. The drying may be accelerated by discharging an inert gas such as a nitrogen gas into the dry core at a boundary between the dry core and the region outside the dry core that is wet by the IPA.

Drying Method 2

The substrate may be dried by using a commonly known sublimation drying technique. A sequence of sublimation drying is approximately as follows. At the end of the process 7, the IPA covering the front surface of the substrate is replaced with a sublimable material dissolved in a solvent. Thereafter, by evaporating the solvent of the sublimable material, the sublimable material is solidified, and, then, by heating the substrate, the sublimable material is sublimated.

Drying Method 3

The substrate may be dried by using a commonly known supercritical drying technique. A sequence of supercritical drying is approximately as follows. While carrying on the discharge of the IPA from the nozzle N3, the rotational speed of the substrate W is reduced to an extremely low speed to form a puddle of the IPA on the front surface of the substrate. Thereafter, the substrate on which the IPA puddle is formed is carried into a supercritical drying apparatus. In a supercritical chamber of the supercritical drying apparatus, the IPA is replaced with a fluid in a supercritical state (for example, supercritical $CO_2$). Then, by setting the inside of the supercritical chamber to normal temperature and pressure, the supercritical $CO_2$ is vaporized and removed from the substrate.

Second Exemplary Embodiment

Below, a second exemplary embodiment of the substrate processing method will be described with reference to FIG. 6A to FIG. 6G. As is clear from FIG. 6A to FIG. 6C (which are the same as FIG. 5A to FIG. 5C), DHF cleaning of a process 1, DHF+IPA cleaning of a process 2, and DIW+IPA rinsing of a process 3 are performed in the second exemplary embodiment as well under the same conditions as in the first exemplary embodiment. Redundant description of the processes 1 to 3 in the second exemplary embodiment will be omitted.

Upon the completion of the processes 1 to 3, processes 4 to 6 are performed. The processes 4 to 6 of the second exemplary embodiment are different from the processes 4 to 6 of the first exemplary embodiment only in that the processing liquid discharged to the front surface of the substrate W from the nozzles N1 and N2 is a mixed solution of DIW and IPA (see FIG. 6D to FIG. 6F). An IPA content in the mixed solution used in the processes 4 to 6 is desirably 5 vol % or more. Here, for example, it is set to be 10 vol %. By setting the IPA content to this level, it is ensured that the mixed solution reaches the bottom of the recess of the pattern, so that a particle-causing substance near the bottom of the recess can be removed more efficiently.

Upon the completion of the processes 4 to 6, a process 7 (see FIG. 6G) and a process 8 (not shown) are performed. The processes 7 and 8 are performed under the same conditions as those of the processes 7 and 8 of the first exemplary embodiment.

Third Exemplary Embodiment

Below, a third exemplary embodiment of the substrate processing method will be described with reference to FIG. 7A to FIG. 7E. This third exemplary embodiment is different from the above-described first and second exemplary embodiments mainly in that only the nozzles N1 and N3 belonging to the arm A1 are used.

Figures 6C, 6D, 6E, 6F:
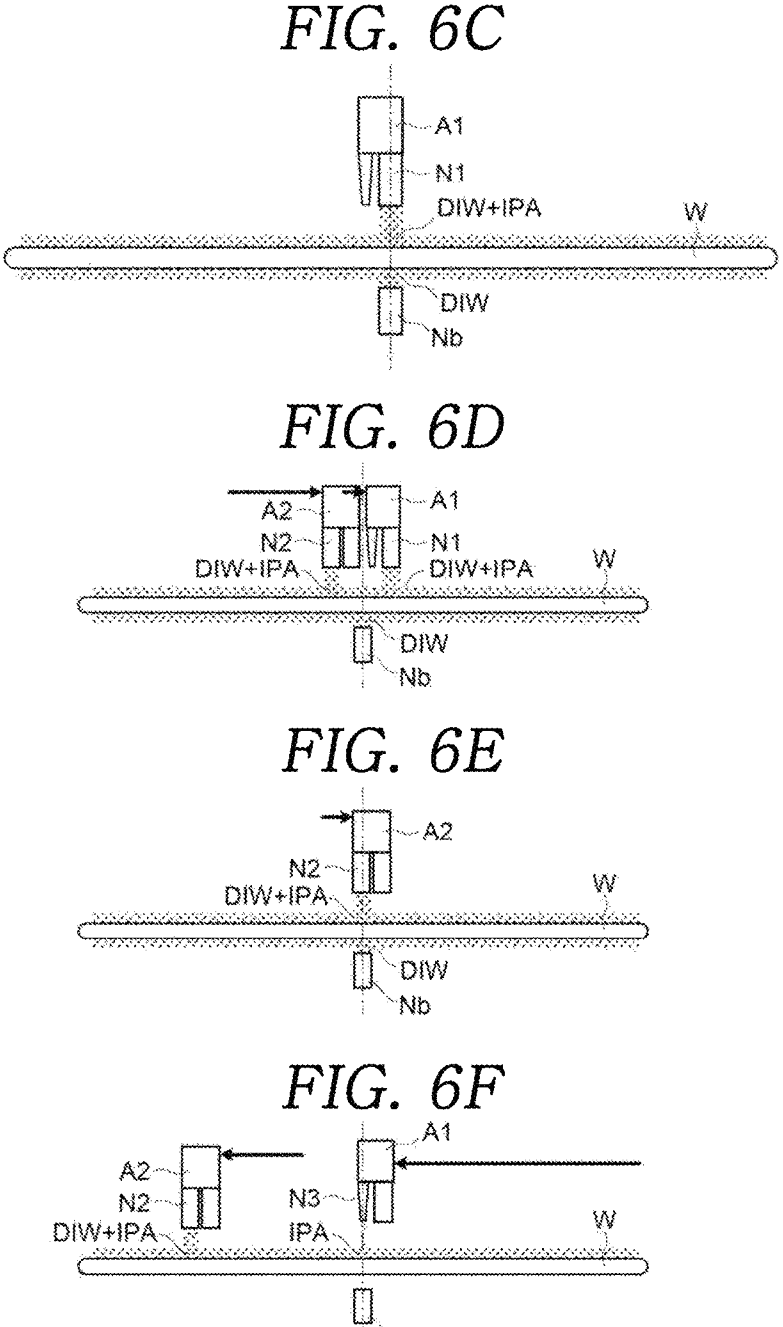
FIG. 6C is a diagram for describing the second exemplary embodiment of the substrate processing method.
FIG. 6D is a diagram for describing the second exemplary embodiment of the substrate processing method.
FIG. 6E is a diagram for describing the second exemplary embodiment of the substrate processing method.
FIG. 6F is a diagram for describing the second exemplary embodiment of the substrate processing method.
Figures 6G, 7A, 7B:
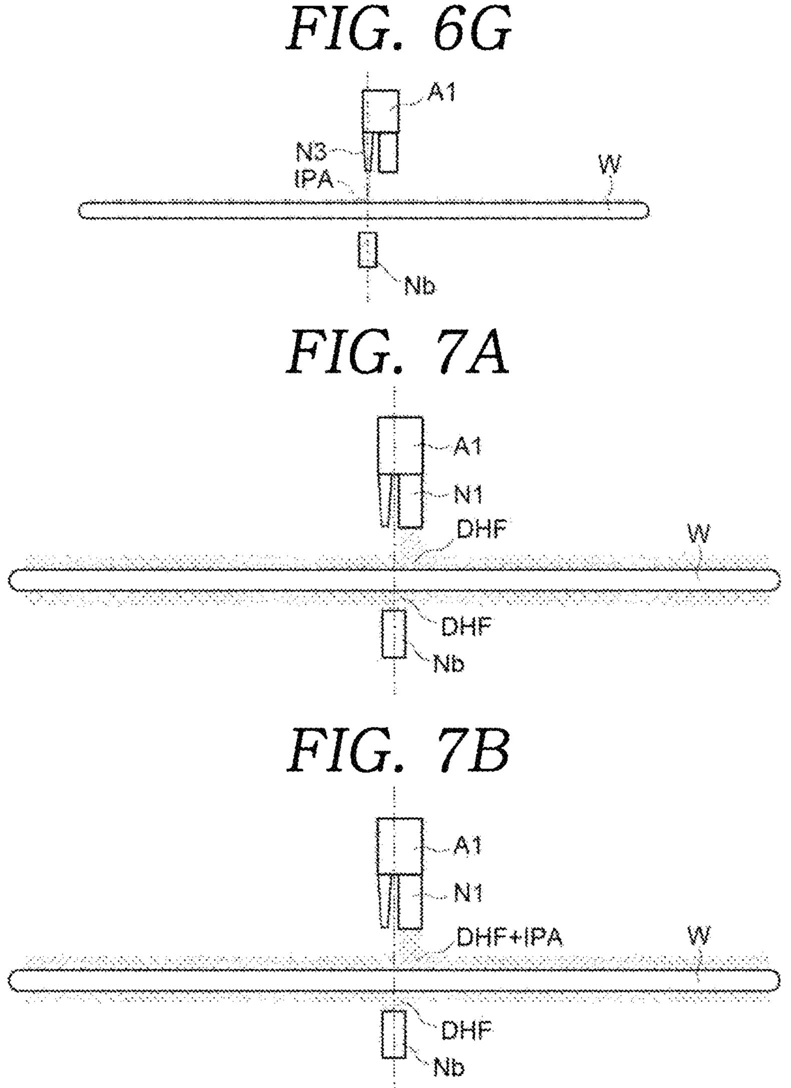
FIG. 6G is a diagram for describing the second exemplary embodiment of the substrate processing method.
FIG. 7A is a diagram for describing a third exemplary embodiment of the substrate processing method.
FIG. 7B is a diagram for describing the third exemplary embodiment of the substrate processing method
Figures 7C, 7D, 7E:
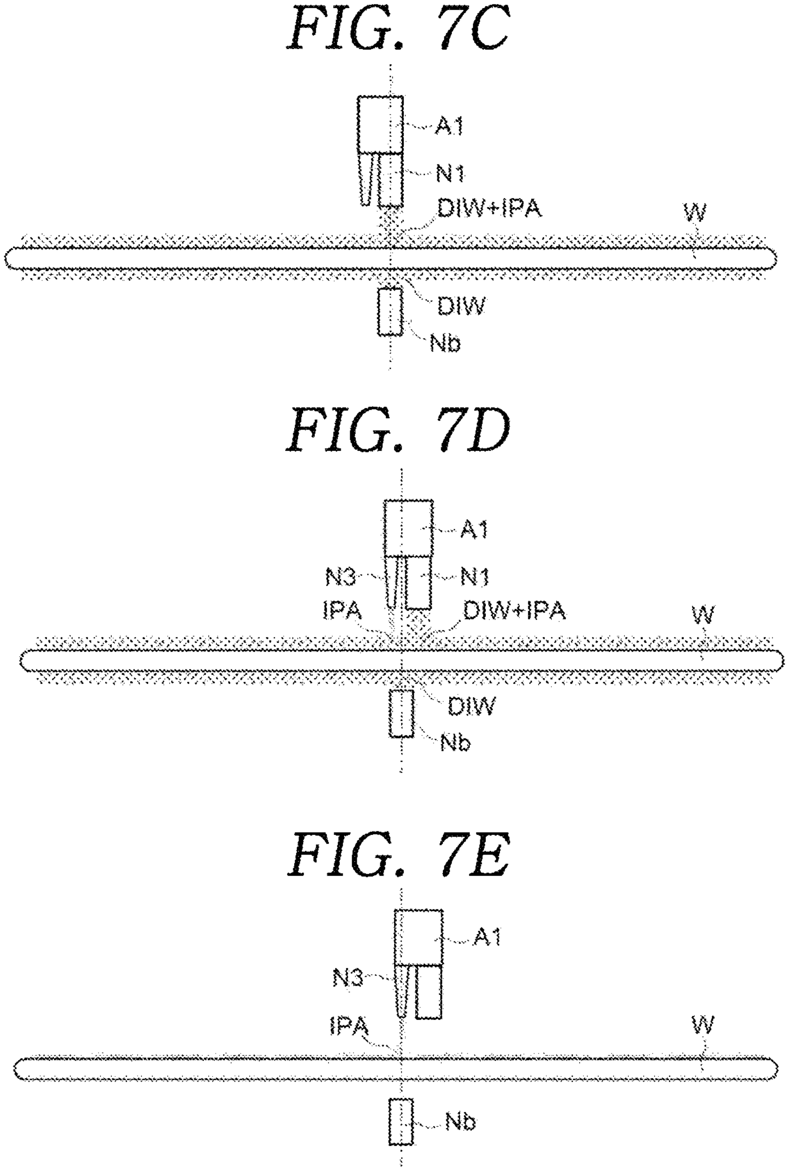
FIG. 7C is a diagram for describing the third exemplary embodiment of the substrate processing method
FIG. 7D is a diagram for describing the third exemplary embodiment of the substrate processing method
FIG. 7E is a diagram for describing the third exemplary embodiment of the substrate processing method.

As is clear from FIG. 7A to FIG. 7C, DHF cleaning of a process 1, DHF+IPA cleaning of a process 2, and DIW+IPA rinsing of a process 3 are performed in the third exemplary embodiment as well under the same conditions as in the first exemplary embodiment. Redundant description of the processes 1 to 3 in the third exemplary embodiment will be omitted.

Next, a process 4 is carried out. In the process 4 of the third exemplary embodiment, while continuing to discharge the mixed solution (DIW+IPA) from the nozzle N1 (at a discharge flow rate of, e.g., 1.5 L/min), IPA is also discharged from the nozzle N3 at a discharge flow rate of, e.g., about 200 mL/min (see FIG. 7D). At this time, the nozzles N1 and N3 are positioned so that a landing point P3 of the mixed solution discharged from the nozzle N1 (having an IPA concentration of, e.g., 10 vol %) on the substrate surface and a landing point P4 of the IPA discharged from the nozzle N3 on the substrate surface are approximately equidistant from the rotation center of the substrate (desirably, so that the landing point P4 is slightly closer to the rotation center of the substrate). The rotation speed of the substrate W may be se to be 1500 rpm, the same as in the processes 1 to 3. Additionally, DIW is discharged from the nozzle Nb toward the central portion of the rear surface of the substrate. The mixed solution discharged from the nozzle N1 and the IPA discharged from the nozzle N3 are mixed on the substrate W, and a resultant mixed solution (also called 'secondary mixed solution' (having an IPA concentration higher than 10 vol %) for distinguishment) covers the entire front surface of the substrate W (including the inside of the recess of the pattern).

After performing the process 4 of the third exemplary embodiment for a predetermined period of time, the processing proceeds to a process 5. In the process 5, the discharge of the mixed solution (DIW+IPA) from the nozzle N1 is stopped, and the discharge of the IPA from the nozzle N3 (at a discharge flow rate of about 200 mL/min) is continued. At this time, a landing point P5 of the IPA from the nozzle N3 is set to coincide with the rotation center of the substrate (see FIG. 7E). By continuing this state for a predetermined time, the entire front surface of the substrate W (including the inside of the recess of the pattern) is finally covered with the IPA having a concentration of approximately 100%.

During the process 4, the concentration of the IPA contained in the mixed solution from the nozzle N1 may be gradually (continuously or stepwise) increased. As an example, the IPA concentration at the beginning of the process 4 may be set to, e.g., 10 vol %, and the IPA concentration may be increased to reach a value higher than 20 vol %, e.g., 35 vol % at the end of the process 4. In this way, by reducing a difference in surface tension between the liquid discharged from the nozzle N1 and the liquid discharged from the nozzle N3, liquid splash is reduced and exposure of the substrate surface due to a Marangoni force can be suppressed. For this reason, the particle level of the substrate W can be reduced. Gradually increasing the concentration of the IPA contained in the mixed solution from the nozzle N1 may be performed before the start of the process 4 (that is, in the process 3). The same operation (gradually increasing the concentration of the IPA contained in the mixed solution) may be performed while performing the process 5 (see FIG. 6E) of the second exemplary embodiment.

According to the above-described exemplary embodiments, the following advantageous effects are obtained.

According to the first to third exemplary embodiments described above, by supplying DHF to the substrate in the initial stage of cleaning (process 1), cleaning (etching) can be performed efficiently in a short time (for example, in a few seconds). After the cleaning has progressed to some extent, a mixed solution of DHF and IPA is supplied to the substrate (process 2). Since the surface tension of the mixed solution (DHF+IPA) is smaller than that of the DHF, the processing liquid (mixed solution) sufficiently reach the bottom of the recess of the pattern. The mixed solution containing the IPA has a slightly lower oxide etching ability than the DHF that does not contain IPA, but it is capable of dissolving a dissolved oxide-derived substance, thus suppressing such a substance from adhering to the bottom of the recess to become a particle. Further, by mixing the IPA with the DHF, coverage during the cleaning (etching) processing can be improved. That is, since the surface tension of the processing liquid (DHF) is lowered by mixing the IPA thereto, a liquid film can be reliably maintained even on a periphery of a substrate (particularly, a substrate having a hydrophobic surface) where run-out of the liquid easily occurs. For this reason, cleaning with high uniformity can be performed from the center of the substrate to the periphery thereof. In addition, it is also possible to suppress particle generation that might be caused due to exposure of the periphery of the substrate to the atmosphere.

Further detailed description will be provided regarding the above points.

Regarding Surface Tension

Figure 8:
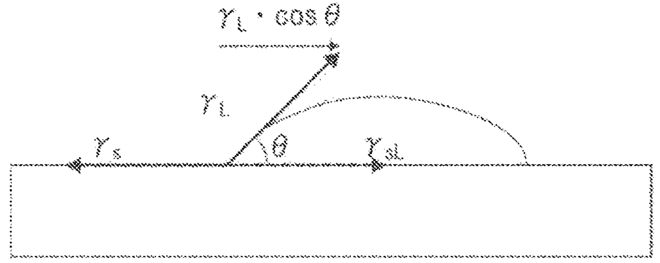
FIG. 8 is a diagram for explaining the concept of an added amount of IPA in relation to a surface tension.

Here, reference is made to FIG. 8. How much the surface tension of the processing liquid should be lowered can be calculated based on the Young's equation below.

$$\cos\theta = (\gamma_S - \gamma_{SL})/\gamma_L$$

θ: Contact angle (deg)

$\gamma_S$: Surface tension of solid (mN/m)

$\gamma_{SL}$: Surface tension of solid-liquid interface (mN/m)

$\gamma_L$: Surface tension of liquid (mN/m)

'Good wetting' means that the contact angle θ equals to zero (θ=0).

When the liquid expands dynamically, θ equal to zero (θ=0), and wettability S can be expressed as $$S = \gamma_S - (\gamma_L + \gamma_{SL}),$$

and when S≥0, it can be said that the liquid has good wettability.

In other words, when $\gamma_S \geq \gamma_L + \gamma_{SL}$ is established, the liquid spontaneously wets the surface of the solid.

In the above equation, $\gamma_L$ at the time when the left and right sides are balanced is defined as a critical surface tension $\gamma_C$ of the solid ($\gamma_C$ is obtained from the Zisman plot).

In the case of a relatively low surface tension, $\gamma_C$ may be treated as being equal to $\gamma_S$ ($\gamma_C = \gamma_S$).

In other words, the minimum necessary condition for good wetting is $$\gamma_C(=\gamma_S) > \gamma_L$$

Since it is known that the surface tension $\gamma_S$ of a surface of silicon (the surface from which an oxide has been removed) is 51.5 mN/m, it is desirable to set the surface tension $\gamma_L$ of the liquid to be sufficiently smaller than this, for example, about 50 mN/m or less.

Furthermore, what is described in this paragraph merely explains the basic concept, and the required surface tension $\gamma_L$ of the liquid can be obtained through an experiment.

According to the literature, the surface tension of water (DIW) without containing IPA is about 72 mN/m, the surface tension of water having an IPA content of 5 vol % is about 48 mN/m, the surface tension of water having an IPA content of 10 vol % is about 40 mN/m, and the surface tension of water having an IPA content of 15 vol % is approximately 35 mN/m, which decrease to draw an inverse curve.

Although the surface tension of HF is somewhat lower than that of DIW, it is assumed that the surface tension of DHF containing about 10 vol % of HF is not significantly different from that of DIW, and it is also assumed that a relationship between the IPA concentration and the surface tension in the mixed solution of DHF+IPA is not significantly different from a relationship between the IPA concentration and the surface tension in the mixed solution of DIW+IPA.

As stated above, since the surface tension of water having the IPA content of 5 vol % is about 48 mN/m, if the mixed solution (DIW+IPA or DHF+IPA) contains IPA of 5 vol % or more, the mixed solution spontaneously diffused on the solid surface. That is, the mixed solution can sufficiently enter the recess of the pattern having a high aspect ratio. Further, as a result of performing a test, it is proved that adding 5 vol % of IPA to the processing liquid (DHF and DIW) significantly reduces the number of particles.

Regarding Etching Rate

In a test conducted by the present inventor, it is proved that the etching rate of an oxide film at a room temperature is approximately 300 Å/min when DHF (not containing IPA) is used, approximately 260 Å/min at an IPA content of 5 vol %, approximately 220 Å/min to 230 Å/min at an IPA content of 10 vol %, and approximately 180 Å/min to 190 Å/min at an IPA content of 15 vol %. Thus, it is confirmed that the etching rate decreases approximately linearly with an increase of the IPA content. That is, even if IPA is added to DHF at a content of approximately 5 vol % to 10 vol %, the etching ability is not lost even though the etching rate decreases slightly. Therefore, in the first to third exemplary embodiments, the transition from the process 1 to the process 2 may need to be performed at a timing when the oxide is almost removed. In other words, unless the transition from the process 1 to the process 2 is performed at an extremely early timing, there is no concern that the processing time (required etching time) will increase to a problematic level.

Other Effects Obtained by Adding IPA

By adding IPA, the dielectric constant of water decreases. Therefore, in DHF, for example, dissociation of HF is suppressed, and the amount of ions decreases. As a result, charging of fine particles (particle-causing substances) on the Si surface and in the liquid is suppressed. In an acidic liquid, the signs of the zeta potential of the fine particles (both organic and inorganic) on the Si surface and in the liquid are reversed, so that an attractive force acts between them. As mentioned above, however, since the amount of charges is reduced by adding the IPA, the fine particles are less likely to adhere to the Si surface. From this point of view as well, the amount of particles can be reduced. This equally applies to the vicinity of the bottom of the recess of the pattern. Furthermore, the aforementioned decrease in the etching rate due to the addition of the IPA can also be explained by the suppression of the dissociation of the HF in the DHF due to the addition of the IPA.

Effects of Rinsing by Mixed Solution of DIW+IPA

In addition, according to the above-described first to third exemplary embodiments, the rinse liquid used in the rinsing (process 3) performed after the cleaning (etching) is the mixed solution of DIW (or $CO_2$ water) and IPA. Therefore, the rinse liquid sufficiently reaches the bottom of the recess of the pattern, so the bottom of the recess is sufficiently rinsed. This may further suppress a particle-causing substance from adhering to the bottom of the recess. Also, as in the case of the cleaning (etching) processing using the mixed solution of DHF+IPA, the surface tension of the rinse liquid is reduced, so that a liquid film can be reliably maintained even on a periphery of a substrate (especially, a substrate having a hydrophobic surface) where liquid run-out is likely to occur. Therefore, a highly uniform rinsing processing can be performed from the center to the periphery of the substrate. Further, it is also possible to suppress particle generation that might be caused due to the exposure of the periphery of the substrate to the atmosphere.

Additionally, according to the second and third exemplary embodiments described above, the processed liquids used in all of the processes subsequent to the process 3 contains IPA. For this reason, in all of those processes, the processing liquids can be more reliably put into the bottom of the recess.

A substrate is processed while varying the amount of IPA added, and a particle increment is investigated. With respect to DHF and DIW in the processes 1 and 2, when no IPA is added, the particle increment is found to be about 156 (19 nm/Adder Particle Counts), and the particle increment is found to be about 117, 101, and 78 when 5 vol % of IPA is added, 10 vol % of IPA is added, and 15 vol % of IPA is added, respectively. That is, it is proved that the particle increment decreases with the increase of the amount of IPA added. Further, when IPA is added to the DIW supplied onto the substrate surface after the process 3, it is found out that the particle increment is further reduced by about ½.

In the first to third exemplary embodiments described above, the processes 1 and 2 may be alternately performed multiple times.

In the first to third exemplary embodiments, the chemical liquid (cleaning liquid or etching liquid) used in the processes 1 and 2 is not limited to HF (DHF), and any of various other chemical liquids containing hydrofluoric acid and water, such as a mixed aqueous solution of HF (hydrofluoric acid) and $HNO_3$ (nitric acid), DSP (a mixed aqueous solution of $H_2SO_4$ (sulfuric acid), $H_2O_2$ (hydrogen peroxide) and HF), BHF (a mixed aqueous solution of (buffered hydrofluoric acid) HF and $NH_4F$), or FPM (a mixed aqueous solution of HF and $H_2O_2$) may be used.

In the above-described first to third exemplary embodiments, ethanol or ethyl lactate may be used instead of IPA. Like IPA, ethanol and ethyl lactate are miscible with water, and their surface tensions and relative dielectric constants are significantly lower than those of water. Therefore, the same effects as obtained by adding IPA described above can be achieved.

In the above-described exemplary embodiments, multiple types of processing liquids are mixed before being discharged from the nozzle Ni (that is, a mixing process is performed before the discharge from the nozzle). However, the present disclosure is not limited thereto, and the multiple types of processing liquids may be mixed on the substrate after being discharged onto the substrate from a plurality of nozzles Ni (that is, the mixing process is performed after the discharge). As a specific example, in the process 2, instead of discharging the mixed solution of DHF and IPA from one nozzle Ni, the DHF may be discharged from the first nozzle Ni and the IPA may be discharged from the second nozzle Ni onto the central portion of the substrate so that the DHF and the IPA may be mixed with each other on the substrate. In this case, the DHF is supplied from the first nozzle Ni to the central portion of the substrate W being rotated (corresponding to the process 1), and, thereafter, the IPA may be supplied to the central portion of the substrate W from the second nozzle Ni while carrying on the supply of the DHF from the first nozzle Ni onto the central portion of the substrate W (corresponding to the process 2).

In the above-described exemplary embodiments, the liquid supplied from the nozzle Nb to the central portion of the rear surface of the substrate does not contain IPA, but it may contain IPA.

It should be noted that the above-described exemplary embodiment is illustrative in all aspects and is not anyway limiting. The above-described exemplary embodiment may be omitted, replaced and modified in various ways without departing from the scope and the spirit of claims.

The substrate is not limited to the semiconductor wafer, and any of various other types of substrates for use in the manufacture of semiconductor devices, such as a glass substrate and a ceramic substrate, may be used.

I claim:

1. A substrate processing method of cleaning a substrate having a patterned Si film while removing an oxide on the Si film, the substrate processing method comprising:

removing the oxide by supplying a cleaning liquid containing hydrofluoric acid and water to the substrate while rotating the substrate; and mixing an organic solvent, which has miscibility with the water and has a lower surface tension than the water, into the cleaning liquid, wherein the mixing of the organic solvent is performed during the removing of the oxide and after a predetermined time has elapsed from a start of the removing of the oxide.

2. The substrate processing method of claim 1, wherein the cleaning liquid containing the hydrofluoric acid is discharged from a first nozzle onto the substrate being rotated, and the mixing of the organic solvent is a process of mixing the organic solvent into the cleaning liquid before the cleaning liquid is discharged from the first nozzle onto the substrate.

3. The substrate processing method of claim 1, wherein the cleaning liquid containing the hydrofluoric acid is discharged from a first nozzle onto the substrate being rotated, and the mixing of the organic solvent is a process of discharging the organic solvent onto the substrate from a second nozzle different from the first nozzle, and mixing the cleaning liquid and the organic solvent on the substrate.

4. The substrate processing method of claim 1, further comprising:

rinsing, after the removing of the oxide, a surface of the substrate by supplying a rinse liquid composed of water or functional water onto the substrate while rotating the substrate, wherein an organic solvent, which has miscibility with water and has a lower surface tension than water, is mixed into the rinse liquid at least in a part of the rinsing of the surface of the substrate.

5. The substrate processing method of claim 2, further comprising:

rinsing, after the removing of the oxide, a surface of the substrate by supplying a rinse liquid composed of water or functional water onto the substrate while rotating the substrate, wherein an organic solvent which has miscibility with water and has a lower surface tension than water is mixed into the rinse liquid at least in a part of the rinsing of the surface of the substrate.

6. The substrate processing method of claim 3, further comprising:

rinsing, after the removing of the oxide, a surface of the substrate by supplying a rinse liquid composed of water or functional water onto the substrate while rotating the substrate, wherein an organic solvent, which has miscibility with water and has a lower surface tension than water, is mixed into the rinse liquid at least in a part of the rinsing of the surface of the substrate.

7. The substrate processing method of claim 4, further comprising:

replacing, after the rinsing of the surface of the substrate, the rinse liquid on the substrate, by supplying the organic solvent onto the substrate while rotating the substrate, with the supplied organic solvent, wherein a concentration of the organic solvent contained in the rinse liquid on the substrate is changed such that the concentration is maximized at an end of the rinsing of the surface of the substrate.

8. The substrate processing method of claim 4, wherein functional water prepared by dissolving carbon dioxide in pure water is used as the rinse liquid in the rinsing of the surface of the substrate.

9. The substrate processing method of claim 7, wherein functional water prepared by dissolving carbon dioxide in pure water is used as the rinse liquid in the rinsing of the surface of the substrate.

10. The substrate processing method of claim 1, wherein the organic solvent mixed into the cleaning liquid is isopropyl alcohol, ethanol, or ethyl lactate.

11. The substrate processing method of claim 4, wherein the organic solvent mixed into the rinse liquid is isopropyl alcohol, ethanol, or ethyl lactate.

12. A substrate processing apparatus, comprising:

a substrate holder rotator configured to hold and rotate a substrate;

a processing liquid supply configured to supply multiple types of processing liquids onto the substrate being rotated by the substrate holder rotator, the multiple types of processing liquids including at least a cleaning liquid containing hydrofluoric acid and water, a rinse liquid, and an organic solvent that has miscibility with the water and has a lower surface tension than the water; and a controller configured to control an operation of at least the substrate holder rotator and the processing liquid supply to cause the substrate processing apparatus to perform a substrate processing method as claimed in claim 1.

* * * * *